(12) United States Patent
Kang et al.

(10) Patent No.: US 9,959,935 B2
(45) Date of Patent: May 1, 2018

(54) INPUT-OUTPUT CIRCUIT FOR SUPPORTING MULTIPLE-INPUT SHIFT REGISTER (MISR) FUNCTION AND MEMORY DEVICE INCLUDING THE SAME

(71) Applicant: Samsung Electronics Co., Ltd., Suwon-si, Gyeonggi-do (KR)

(72) Inventors: Sukyong Kang, Suwon-si (KR); Won-Joo Yun, Yongin-si (KR); Hye-Seung Yu, Goyang-si (KR); Hyun-Ui Lee, Osan-si (KR); Jae-Hun Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/480,724

(22) Filed: Apr. 6, 2017

(65) Prior Publication Data

US 2017/0294236 A1 Oct. 12, 2017

Related U.S. Application Data

(60) Provisional application No. 62/321,417, filed on Apr. 12, 2016.

(30) Foreign Application Priority Data

Jun. 23, 2016 (KR) .......................... 10-2016-0078585

(51) Int. Cl.
*G11C 29/12* (2006.01)
*G11C 11/4076* (2006.01)
*G11C 11/4096* (2006.01)

(52) U.S. Cl.
CPC .......... *G11C 29/12* (2013.01); *G11C 11/4076* (2013.01); *G11C 11/4096* (2013.01)

(58) Field of Classification Search
CPC .................................................. G11C 29/022
USPC ............................................................ 714/30
See application file for complete search history.

(56) References Cited

U.S. PATENT DOCUMENTS

| | | | | |
|---|---|---|---|---|
| 6,760,873 B1 * | 7/2004 | Hao | .................... | G01R 31/3016 324/73.1 |
| 7,650,553 B2 * | 1/2010 | Komura | ........... | G01R 31/31905 702/117 |
| 7,743,288 B1 * | 6/2010 | Wang | ................. | G01R 31/3171 714/703 |
| 2003/0172240 A1 * | 9/2003 | Johnson | .................. | G06F 13/28 711/167 |

(Continued)

*Primary Examiner* — Min Huang
(74) *Attorney, Agent, or Firm* — Myers Bigel, P.A.

(57) ABSTRACT

An input-output circuit includes a reception circuit and a register circuit. The reception circuit operates in accordance with a normal write protocol commonly in a normal write mode and a test write mode. The reception circuit receives a plurality of input signals to generate a plurality of latch signals. The register circuit generates a plurality of test result signals based on the latch signals in the test write mode. The input-output circuit may perform the multiple-input shift register (MISR) function in accordance with the normal write path and the normal write protocol. The MISR function may be performed efficiently without consideration of additional timing adjustment for the test write operation because the MISR function is performed under the same timing condition as the normal write operation.

15 Claims, 16 Drawing Sheets

(56) References Cited

U.S. PATENT DOCUMENTS

| | | | |
|---|---|---|---|
| 2016/0005445 A1* | 1/2016 | Jeong | G11C 7/22 365/194 |
| 2016/0161552 A1* | 6/2016 | Ware | G01R 31/31726 324/762.01 |
| 2016/0180914 A1* | 6/2016 | Kong | G11C 11/4093 365/189.05 |

* cited by examiner

1000

| M1 | M0 | FUNCTION |
|---|---|---|
| 0 | 0 | RESET |
| 0 | 1 | LFSR |
| 1 | 0 | REGISTER |
| 1 | 1 | MISR |

INPUT-OUTPUT CIRCUIT FOR SUPPORTING MULTIPLE-INPUT SHIFT REGISTER (MISR) FUNCTION AND MEMORY DEVICE INCLUDING THE SAME

REFERENCE TO PRIORITY APPLICATION

This U.S. Non-provisional application claims priority under 35 USC § 119 to U.S. Provisional Application No. 62/321,417, filed Apr. 12, 2016 and Korean Patent Application No. 10-2016-0078585, filed Jun. 23, 2016, the disclosures of which are hereby incorporated by reference in their entireties herein.

FIELD OF THE INVENTION

The present invention relates to integrated circuit devices and, more particularly, input/output (I/O) data circuits and methods of operating same.

BACKGROUND

A high bandwidth memory (HBM) is being developed as a next-generation graphic memory for substituting double data rate 5 (DDR5) synchronous dynamic random access memory (SDRAM), wide input-output memory, etc. The HBM may provide multiple-input shift register or multiple-input signature register (MISR) function to test and train a communication link between the HBM and a host device. For the MISR function, the HBM may include a shift register circuit having multiple input terminals with a feedback loop. The shift register circuit may receive and compress input data from the host device to generate a signature, that is, test result data. The signature may be returned to the host device to compare the signature with a predicted value stored in the host device. When there is a mismatch between the signature and the predicted value, the host device may resend the input data with a modified timing condition to find a correct transmission condition, or the host may replace the faulty link with a redundant link.

Although a MISR circuit may not require registers to store all of the input data, additional circuits for the MISR function may cause design overheads for the HBM. Furthermore, if a setup/hold margin for a test operation has to be adjusted independently from a setup/hold margin for a normal access operation, the design burden may be increased significantly.

SUMMARY

Some example embodiments may provide an input-output circuit of a memory device capable of efficiently supporting a multiple-input shift register (MISR) function.

Some example embodiments may provide a memory device and a memory system including the input-output circuit.

According to example embodiments, an input-output circuit includes a reception circuit configured to operate in accordance with a normal write protocol commonly in a normal write mode and a test write mode and configured to receive a plurality of input signals to generate a plurality of latch signals and a register circuit configured to generate a plurality of test result signals based on the latch signals in the test write mode.

According to example embodiments, an input-output circuit includes a plurality of input-output pins receiving a plurality of input signals, a reception circuit configured to operate in synchronization with a clock signal in accordance with a normal write protocol commonly in a normal write mode and a test write mode and configured to receive the input signals to generate a plurality of latch signals and a register circuit configured to operate in synchronization with a delayed clock signal that is delayed from the clock signal in the test write mode and generate a plurality of test result signals based on the latch signals in the test write mode.

The input-output circuit of the memory device according to example embodiments may perform the MISR function in accordance with the normal write path and the normal write protocol. The MISR function may be performed efficiently without consideration of additional timing adjustment for the test write operation because the MISR function is performed under the same timing condition as the normal write operation. In addition, input-output circuit of the memory device according to example embodiments may enhance reliability of the test result by filtering the command-address signal corresponding to the preamble clock of the system clock signal in case of the test of the command-address link.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
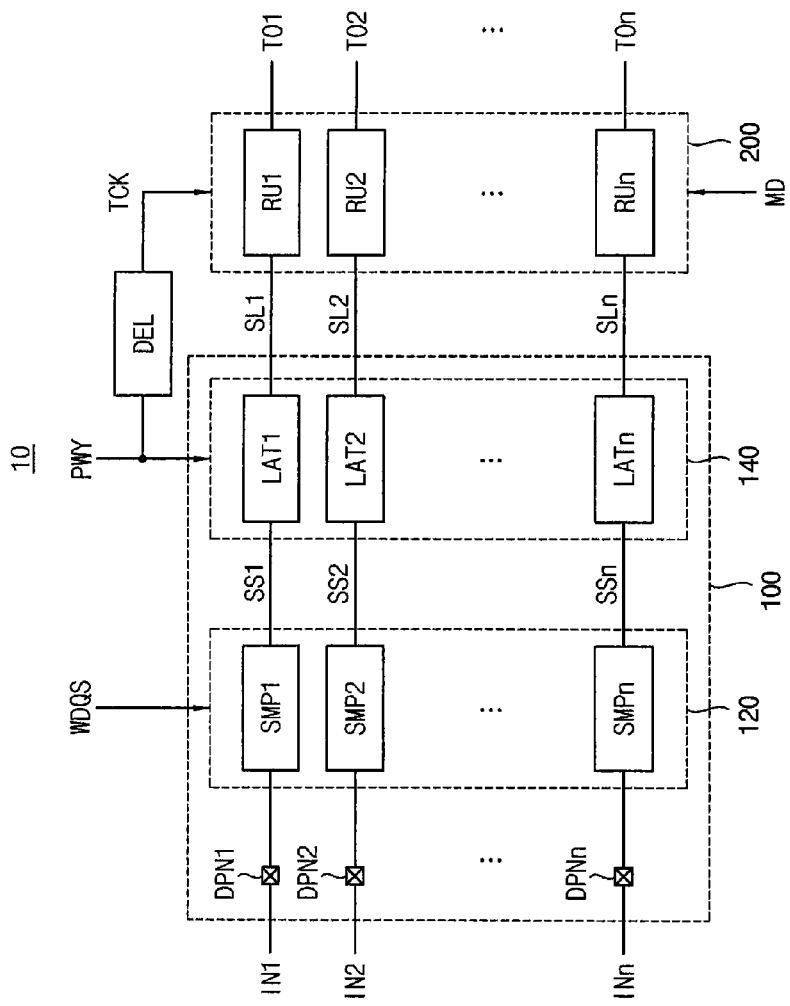
FIG. 1 is a diagram illustrating an input-output circuit of a memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a diagram illustrating an input-output circuit of a memory device according to example embodiments. Referring to FIG. 1, an input-output circuit 10 may include a reception circuit 100 and a register circuit 200. The reception circuit 100 operates in accordance with a normal write protocol commonly in a normal write mode and also in a test write mode. The reception circuit 100 receives a plurality of input signals IN1~INn to generate a plurality of latch signals SL1~SLn. The normal write protocol will be described below with reference to FIGS. 5 through 8.

The register circuit 200 generates a plurality of test result signals TO1~TOn based on the latch signals SL1~SLn in the test write mode. The register circuit 200 may be disabled in the normal write mode and enabled in the test write mode in response to a mode signal MD indicating the normal write mode or the test write mode. For example, the mode signal MD may be generated from the control logic 410 in FIG. 3 based on test information stored in the mode register 412.

In some example embodiments, the input-output circuit 10 may correspond to a data input-output circuit for communicating data signals with a host device. In this case, the data input-output circuit 10 may include a plurality of data pins DPN1~DPNn, a sampling block 120 and a latch block 140. The data pins DPN1~DPNn may receive data signals as the input signals IN1~INn, respectively. The sampling block 120 may include a plurality of sampling circuits SMP1~SMPn configured to sample the data signals 1N1~INn in synchronization with a write data strobe signal WDQS to generate a plurality of sampled signals SS1~SSn, respectively. The latch block 140 may include a plurality of latch circuits LAT1~LATn configured to latch the sampled signals SS1~SSn in synchronization with a write master clock signal PWY to generate the latch signals SL1~SLn, respectively. The register circuit 200 may include a plurality of register units RU1~RUn configured to receive the latch signals SL1~SLn from the latch circuits LAT1~LATn to generate the test result signals TO1~TOn, respectively.

Figure 3:
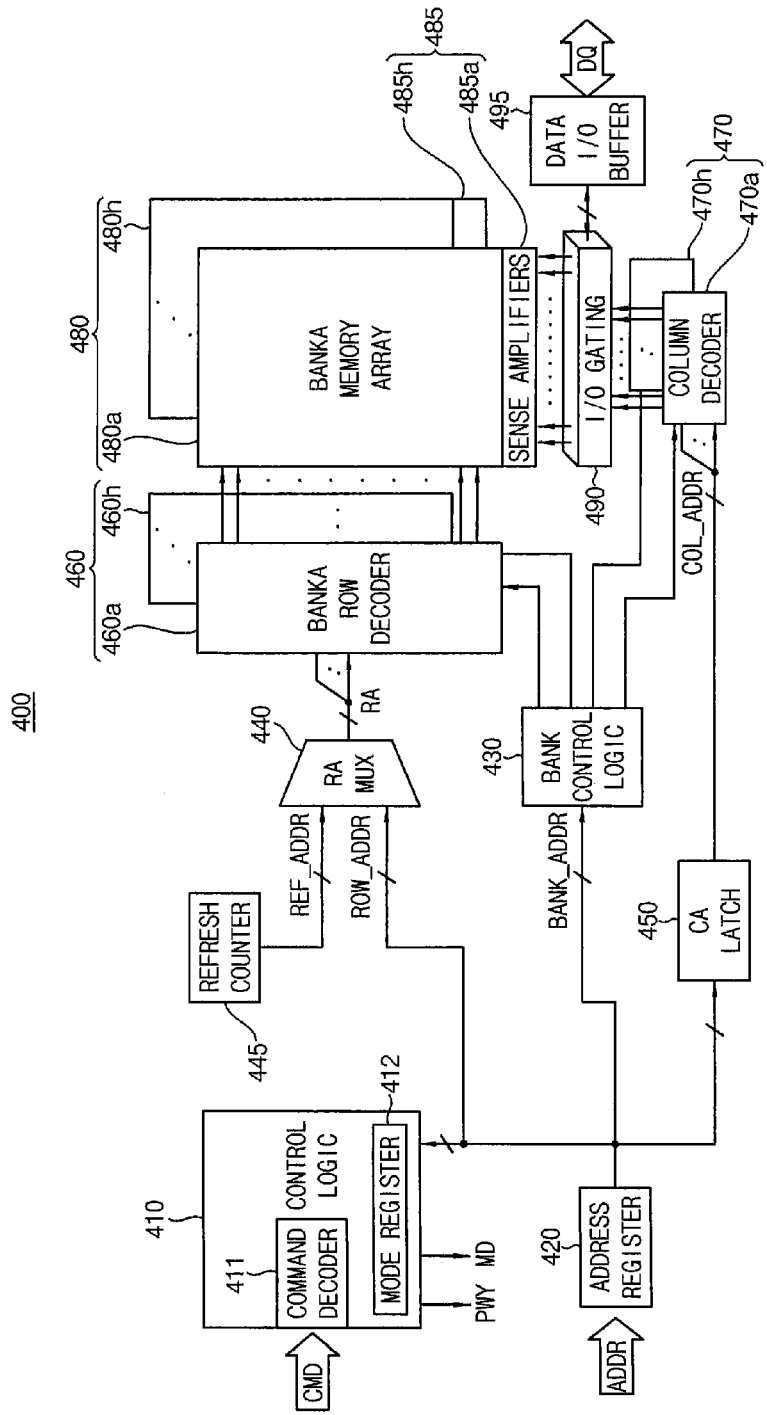
FIG. 3 is a diagram illustrating an example embodiment of an internal circuit included in a memory device in FIG. 2.

For example, the write master clock signal PWY may be generated by the control logic 410 in FIG. 3 based on information stored in the mode register 412. The mode register 412 may store information including a write latency and a burst length in accordance with the normal write protocol, and the control logic 410 may generate the write master clock signal PWY based on the write latency and the burst length stored in the mode register 412. The write master clock signal PWY in accordance with the normal write protocol will be further described with reference to FIGS. 5 through 8.

The data input-output circuit 10 may further include a delay circuit DEL configured to delay the write master clock signal PWY to generate a test clock signal TCK. The register circuit 200 may operate in synchronization with the test clock signal TCK. As will be described below, the register circuit 200 may form a feedback loop to perform the MISR function.

Figure 2:
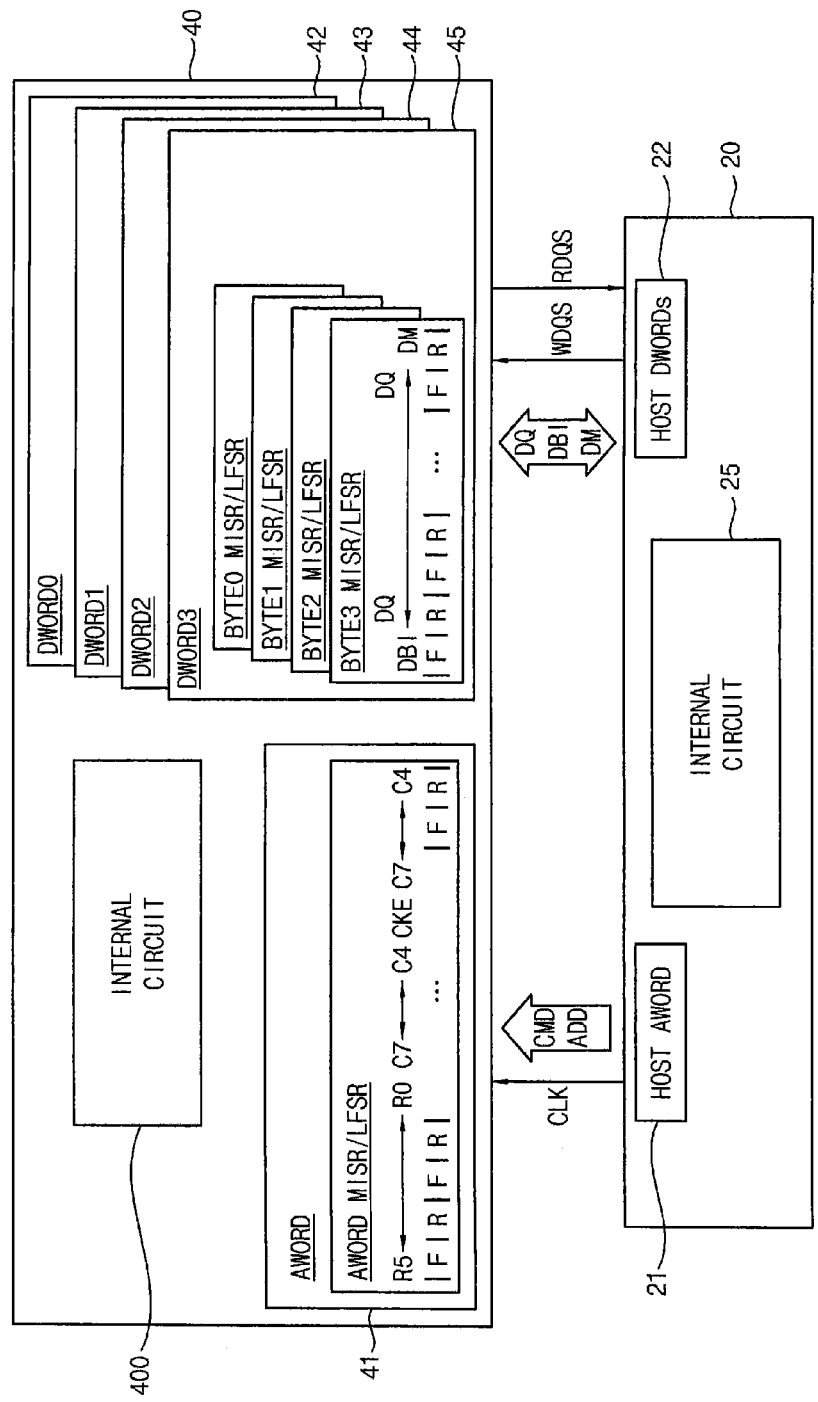
FIG. 2 is a diagram illustrating a memory system including an input-output circuit according to example embodiments.

In the normal write mode, the latch signals SL1~SLn may be provided to the internal circuit 400 in FIGS. 2 and 3 and the write data of latch signals SL1~SLn may be written in the memory cell array. In the test write mode, the latch signals SL1~SLn may be provided to the register circuit 200 and the latch signals SL1~SLn may be used to generate the test result signals TO1~TOn.

As such, the input-output circuit 10 of the memory device according to example embodiments may perform the MISR function in accordance with the normal write path and the normal write protocol. The MISR function may be performed efficiently without consideration of additional timing adjustment for the test write operation because the MISR function is performed under the same timing condition as the normal write operation.

FIG. 2 is a diagram illustrating a memory system including an input-output circuit according to example embodiments. Referring to FIG. 2, a memory system 1000 may include a host device 20 such as a memory controller and a memory device 40. The memory device 40 may include a command-address input-output block AWORD 41, data input-output blocks DWORD0~DWORD3 42~45 and an internal circuit 400. The host device 20 may include a command-address input-output block 21, data input-output blocks 22 and an internal circuit 25. For example, the memory device 40 may be compatible with HBM standards.

The command CMD, the address ADD, the system clock signal CLK, the clock enable signal CKE, etc. may be transferred from the command-address input-output block 21 of the host device 20 to the command-address input-output block 41 of the memory device 40. The data DQ, the data bus inversion signal DBI, the data mask signal DM, the write data strobe signal WDQS, the read data strobe signal RDQS, etc. may be transferred between the data input-output blocks 22 of the host device 20 and the data input-output blocks 42~45 of the memory device 40.

The multiple-input shift register (MISR) and/or the linear feedback shift register (LFSR) may be implemented in the input-output blocks 41~45 of the memory device 40. Using the MISR/LFSR circuits, the links between the host device 20 and the memory device 40 may be tested and trained.

For example, as illustrated in FIG. 2, the MISR/LFSR circuit corresponding to one byte included in the data input-output blocks 42~45 may have a size of 20 bits. The 20 bits may include rising bits R and falling bits F of the byte data signal, the data bus inversion signal DBI and the data mask signal DM. The MISR/LFSR circuit of the command address input-output block 41 may have a size of 30 bits. The 30 bits may include rising bits R and falling bits F of the row command bits R0~R5, the column command bits C0~C7 and the clock enable signal CKE.

For example, one channel includes four data input-output blocks 42~45 corresponding to four words, and each of the four data input-output blocks 42~45 may include four MISR/LFSR circuits corresponding to four bytes BYTE0~BYTE3. When the stored values in the MISR/LFSR circuit of the data input-output blocks 42~45 are read out through the DWORD_MISR instruction in accordance with the IEEE 1500 standards, the test result data of the entire 320 bits may be output in series and then provided to the host device 20. In the same way, when the stored values in the MISR/LFSR circuit of the command-address input-output block 41 are read out through the AWORD_MISR instruction in accordance with the IEEE 1500 standards, the test result data of the entire 30 bits may be output in series and then provided to the host device 20. The test write mode may include a LFSR mode, a register mode and a MISR mode as will be described below with reference to FIGS. 11 and 12.

FIG. 3 is a diagram illustrating an example embodiment of an internal circuit included in a memory device in FIG. 2. Referring to FIG. 3, a memory region or an internal circuit 400 of the memory device may include a control logic 410, an address register 420, a bank control logic 430, a row address multiplexer 440, a column address latch 450, a row decoder 460, a column decoder 470, a memory cell array

480, a sense amplifier unit 485, an input/output (I/O) gating circuit 490, a data input/output (I/O) buffer 495, and a refresh counter 445.

The memory cell array 480 may include a plurality of bank arrays 480a~480h. The row decoder 460 may include a plurality of bank row decoders 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR and a column address COL_ADDR from the memory controller. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input/output gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 470a~470h, and write drivers for writing data to the bank arrays 470a~470h.

Data to be read from one bank array of the bank arrays 470a~470h may be sensed by a sense amplifier 485 coupled to the one bank array from which the data is to be read, and may be stored in the read data latches. The data stored in the read data latches may be provided to the memory controller via the data I/O buffer 495. Data DQ to be written in one bank array of the bank arrays 470a~470h may be provided to the data I/O buffer 495 from the memory controller. The write driver may write the data DQ in one bank array of the bank arrays 470a~470h.

The control logic 410 may control operations of the internal circuit 400. For example, the control logic 410 may generate control signals for the internal circuit 400 in order to perform a write operation or a read operation. The control logic 410 may include a command decoder 411 that decodes a command CMD received from the memory controller and a mode register 412 that sets an operation mode of the memory device. For example, the command decoder 411 may generate the control signals corresponding to the command CMD by decoding a write enable signal, a row address strobe signal, a column address strobe signal, a chip selection signal, etc.

The write master clock signal PWY may be generated by the control logic 410 based on information stored in the mode register 412. The mode register 412 may store information including a write latency and a burst length in accordance with the normal write protocol. The control logic 410 may generate the write master clock signal PWY based on the write latency and the burst length stored in the mode register 412. The write master clock signal PWY in accordance with the normal write protocol will be further described with reference to FIGS. 5 through 8. In addition, the mode signal MD may be generated by the control logic 410 based on the test information stored in the mode register 412. The mode register 412 may be in accordance with the HBM standards and the detailed descriptions of the mode register 412 are omitted.

Figure 4:
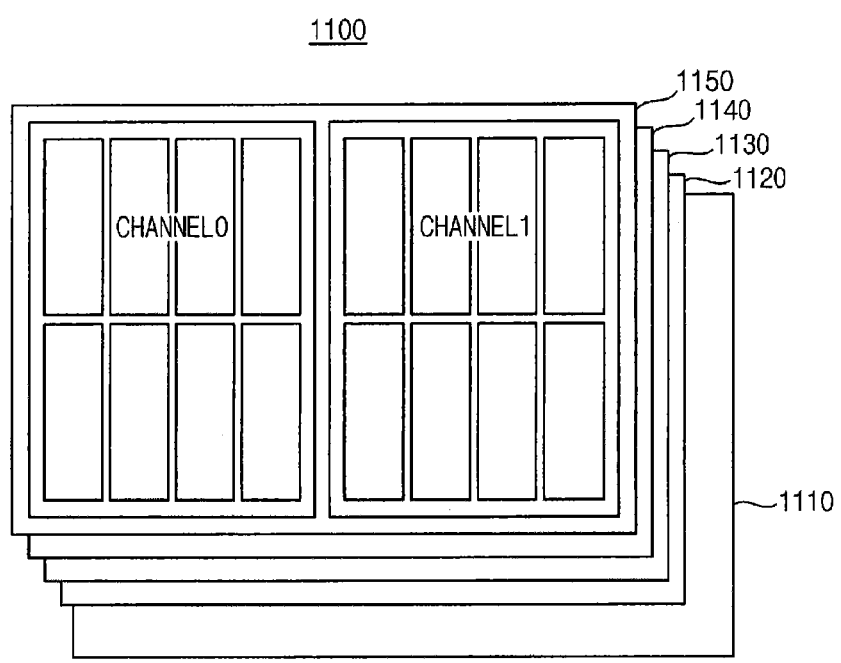
FIG. 4 is a diagram illustrating an example high bandwidth memory (HBM) organization.

FIG. 4 is a diagram illustrating an example high bandwidth memory (HBM) organization. Referring to FIG. 4, the HBM 1100 may be configured to have a stack of multiple DRAM semiconductor dies 1120, 1130, 1140 and 1150. The HBM of the stack structure may be optimized by a plurality of independent interfaces called channels. Each DRAM stack may support up to 8 channels in accordance with the HBM standards. FIG. 4 shows an example stack containing 4 DRAM semiconductor dies 1120, 1130, 1140 and 1150, and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous. The HBM 1100 may further include an interface die 1110 or a logic die disposed at bottom of the stack structure to provide signal routing and other functions. Some function for the DRAM semiconductor dies 1120, 1130, 1140 and 1150 may be implemented in the interface die 1110.

The HBM standards may require the MISR circuit for testing and training the links between the host device and the memory device. The register circuit 200 included in the input-output circuit 10 of FIG. 1 may perform the MISR function in accordance with the HBM standards.

Figure 5:
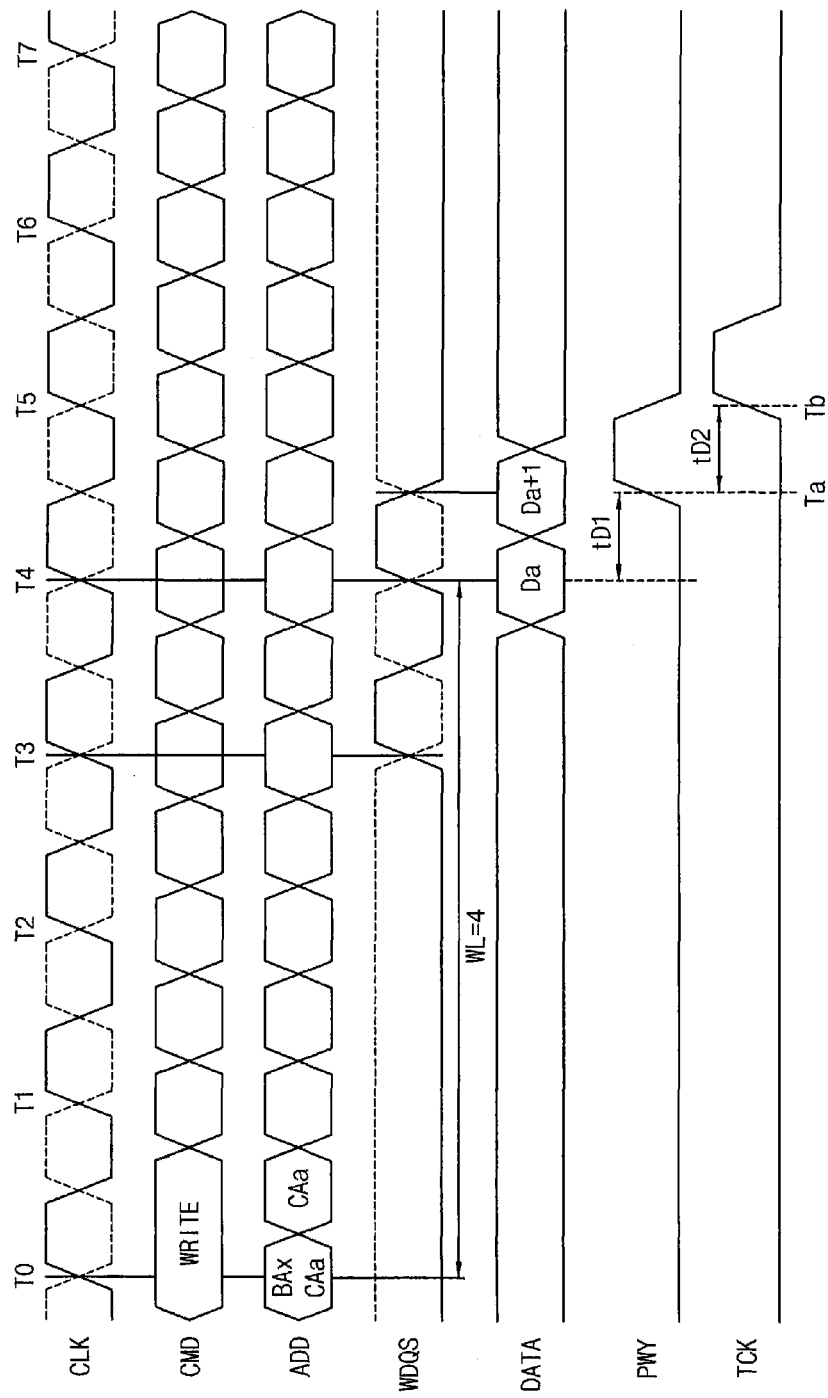
FIGS. 5 through 8 are timing diagrams illustrating examples of a write operation and test clock generation in accordance with a normal write protocol.
Figure 6:
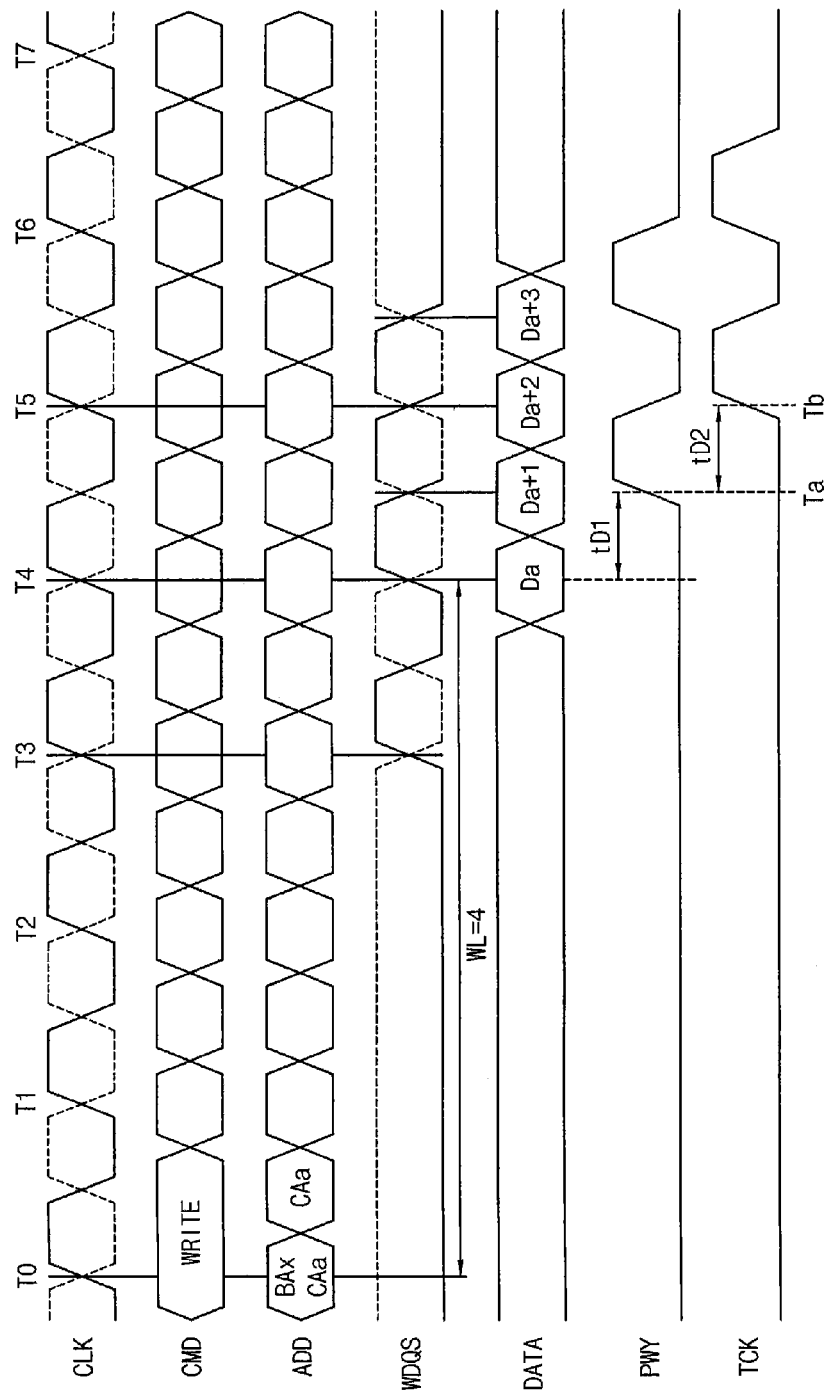

FIGS. 5 through 8 are timing diagrams illustrating examples of a write operation and test clock generation in accordance with a normal write protocol. FIG. 5 illustrates the single write burst with the burst length of two and FIG. 6 illustrates the signal write burst with the burst length of four. The time points T0~T7 correspond to rising edges of a system clock signal CLK provided form the host device to the memory device. At the time point T0, a write command WRITE is provided through a command signal CMD and a bank address BAx and a column address CAa are provided through an address signal ADD. A write data strobe signal WDQS includes a preamble clock of the time duration T3~T4 and the data bits Da, Da+1, Da+2 and Da+3 are provided in synchronization with the edges of the write data strobe signal WDQS after the time point T4 corresponding to the write latency WL (e.g., 4 clocks) from the write command WRITE.

The control logic 410 in FIG. 3 may generate a write master clock signal PWY based on the write latency WL and the burst length BL stored in the mode register 412. The activation timing of the write master clock signal PWY corresponds to the time point Ta after the write latency WL and a first delay time tD1 from the time point T0 of the write command WRITE. The first delay time tD1 is determined depending on the setup/hold time of the sampling block 120 in FIG. 1. The toggling number or the clock number of the write master clock signal PWY may be determined based on the burst length BL. The write master clock signal PWY may include one clock when the burst length BL is two as illustrated in FIG. 5, and the write master clock signal PWY may include two clocks when the burst length BL is four as illustrated in FIG. 6.

The delay circuit DEL in FIG. 1 may delay the write master clock signal PWY to generate a test clock signal TCK. The activation timing of the test clock signal TCK corresponds to the time point Tb after a second delay time tD2 from the activation time point Ta of the write master clock signal PWY. The second delay time tD2 is determined depending on the setup/hold time of the latch block 140 in FIG. 1.

Figure 7:
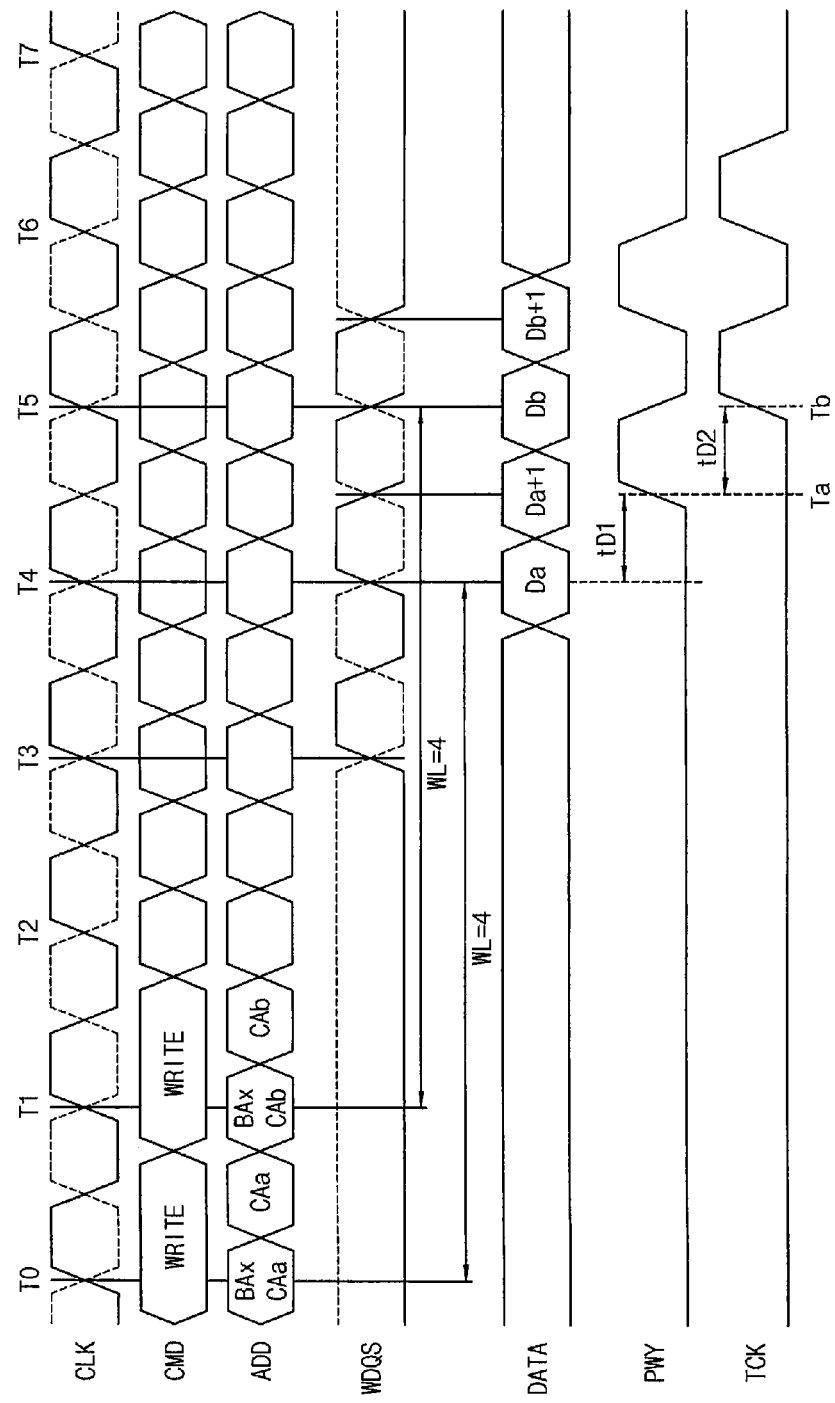
Figure 8:
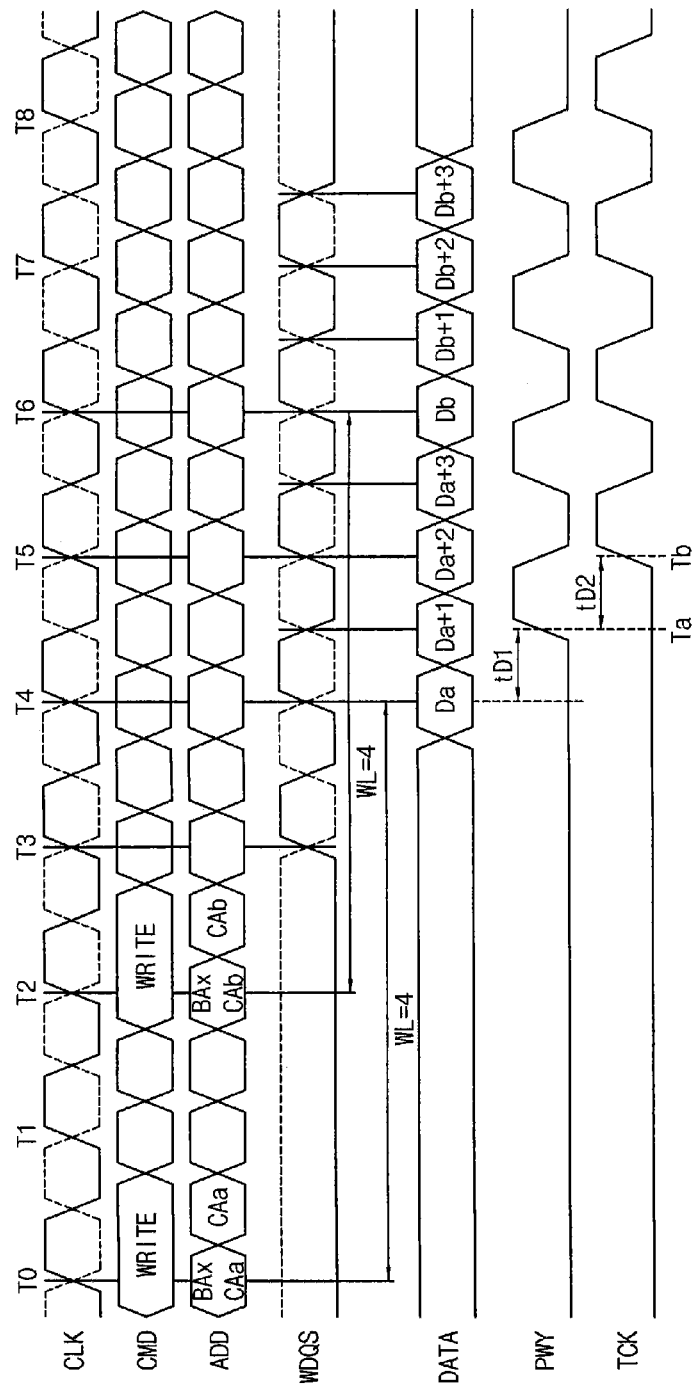

FIG. 7 illustrates the seamless write bursts with the burst length of two and FIG. 8 illustrates the seamless write bursts with the burst length of four. The time points T0~T7 correspond to rising edges of a system clock signal CLK provided form the host device to the memory device. At the time point T0, a first write command WRITE is provided through the command signal CMD and a bank address BAx and a column address CAa are provided through the address signal ADD. When the burst length BL is two, a second write command WRITE is provided through the command signal CMD and the bank address BAx and a column address CAb is provided through the address signal ADD at the time point T1 as illustrated in FIG. 7. When the burst length BL is four, the second write command WRITE is provided through the command signal CMD and the bank address BAx and the column address CAb is provided through the address signal ADD at the time point T2 as illustrated in FIG. 8.

The write data strobe signal WDQS includes the preamble clock of the time duration T3~T4 and the data bits Da, Da+1, Da+2, Da+3, Db, Db+1, Db+2 and Db+3 are provided in synchronization with the edges of the write data strobe signal WDQS after the time point T4 corresponding to the write latency WL (e.g., 4 clocks) from the first write command WRITE.

The control logic 410 in FIG. 3 may generate a write master clock signal PWY based on the write latency WL and the burst length BL stored in the mode register 412. The activation timing of the write master clock signal PWY corresponds to the time point Ta after the write latency WL and the first delay time tD1 from the time point T0 of the write command WRITE. The first delay time tD1 is determined depending on the setup/hold time of the sampling block 120 in FIG. 1. The toggling number or the clock number of the write master clock signal PWY may be determined based on the burst length BL. The write master clock signal PWY may include two clocks corresponding to the two write commands when the burst length BL is two as illustrated in FIG. 7, and the write master clock signal PWY may include four clocks corresponding to the two write commands when the burst length BL is four as illustrated in FIG. 8.

The delay circuit DEL in FIG. 1 may delay the write master clock signal PWY to generate the test clock signal TCK. The activation timing of the test clock signal TCK corresponds to the time point Tb after the second delay time tD2 from the activation time point Ta of the write master clock signal PWY. The second delay time tD2 is determined depending on the setup/hold time of the latch block 140 in FIG. 1.

The write master clock signal PWY may be generated in accordance with the normal write protocol and the test clock signal TCK may be generated by simply delaying the write master clock signal PWY. The latched data in the latch block 140 are already in the domain of the write master clock signal PWY and thus the operation timing of the register circuit 200 may be controlled by adjusting the delay time of the delay circuit DEL regardless of the timing of the write data strobe signal WDQS.

As such, the input-output circuit of the memory device according to example embodiments may perform the MISR function in accordance with the normal write path and the normal write protocol. The MISR function may be performed efficiently without consideration of additional timing adjustment for the test write operation because the MISR function is performed under the same timing condition as the normal write operation.

Figure 9:
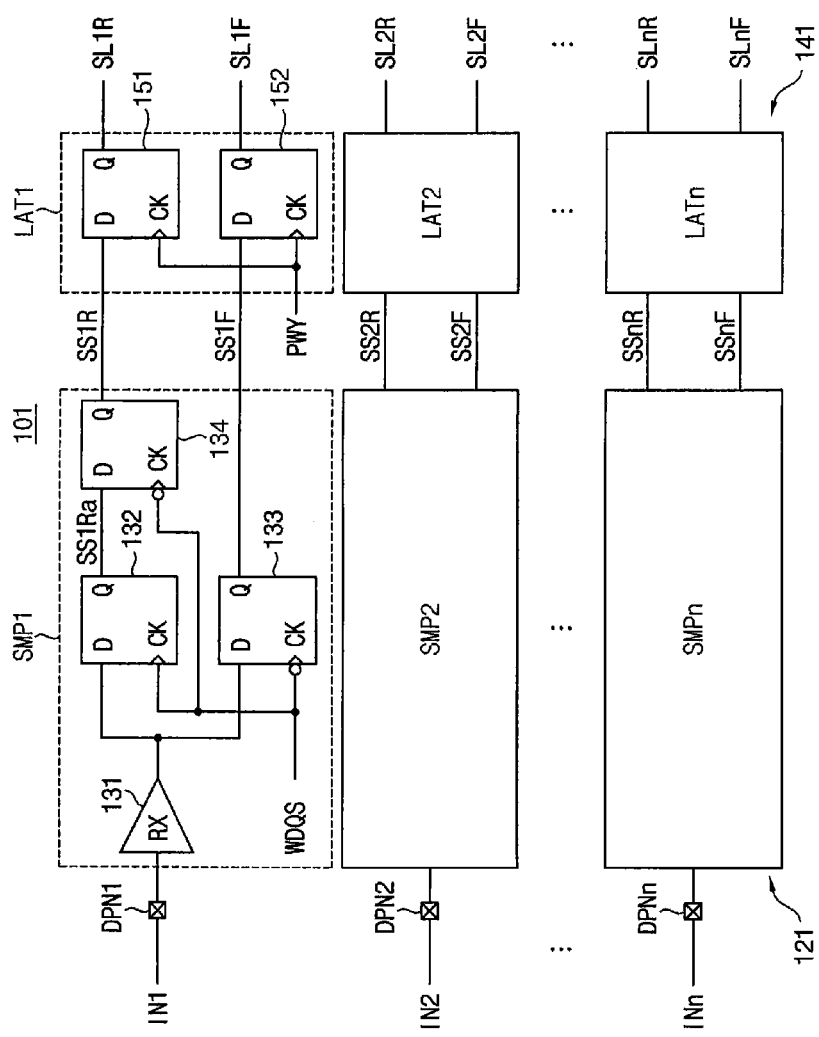
FIG. 9 is a diagram illustrating an example embodiment of a reception circuit included in the input-output circuit of FIG. 1.

FIG. 9 is a diagram illustrating an example embodiment of a reception circuit included in the input-output circuit of FIG. 1. Referring to FIG. 9, a reception circuit 101 may include a plurality of data pins DPN1~DPNn, a sampling block 121 and a latch block 141. The data pins DPN1~DPNn may receive data signals as the input signals IN1~INn, respectively. The sampling block 121 may include a plurality of sampling circuits SMP1~SMPn configured to sample the data signals IN1~INn in synchronization with a write data strobe signal WDQS to generate a plurality of sampled signals SS1~SSn, respectively. The latch block 141 may include a plurality of latch circuits LAT1~LATn configured to latch the sampled signals SS1~SSn in synchronization with a write master clock signal PWY to generate the latch signals SL1~SLn, respectively.

FIG. 9 illustrates an example embodiment corresponding to a case that the data signals IN1~INn are transferred by a double data rate (DDR) scheme. Hereinafter, an example embodiment of the first sampling circuit SMP1 and the first latch circuit LAT1 are described with reference to FIG. 9. The other sampling circuits SMP2~SMPn and the other latch circuits LAT2~LATn have substantially the same configurations as the first sampling circuit SMP1 and the first latch circuit LAT1, and thus repeated illustration and description are omitted. The operation of the reception circuit 101 will be described below with reference to FIG. 13.

The first sampling circuit SMP1 may include a receiver RX 131, a first flip-flop 132, a second flip-flop 133 and a third flip-flop 134. The receiver 131 may buffer the data signal IN1 to provide a buffered data signal. The first flip-flop 132 has a data terminal D receiving the output of the receiver 131, a clock terminal CK receiving the write data strobe signal WDQS and an output terminal Q providing a sampled signal SS1Ra. The second flip-flop 133 has a data terminal D receiving the output of the receiver 131, a clock terminal CK receiving an inversion signal of the write data strobe signal WDQS and an output terminal Q providing a falling sampled signal SS1F. The third flip-flop 134 has a data terminal D receiving the output of the first flip-flop 132, a clock terminal CK receiving the inversion signal of the write data strobe signal WDQS and an output terminal Q providing a rising sampled signal SS1R.

As such, each sampling circuit SMPi (i=1~n) is configured to sample each data signal INi in synchronization with rising edges of the write data strobe signal WDQS to generate each rising sampled signal SSiR and sample each data signal INi in synchronization with falling edges of the write data strobe signal WDQS to generate each falling sampled signal SSiF.

The first latch LAT1 may include a fourth flip-flop 151 and a fifth flip-flop 152. The fourth flip-flop 151 has a data terminal D receiving the rising sampled signal SS1R, a clock terminal CK receiving the write master clock signal PWY and an output terminal Q providing a rising latch signal SL1R. The fifth flip-flop 152 has a data terminal D receiving the falling sampled signal SS1F, a clock terminal CK receiving the write master clock signal PWY and an output terminal Q providing a falling latch signal SL1F.

As such, each latch circuit LATi (i=1~n) is configured to latch each rising sampled signal SSiR in synchronization with the write master clock signal PWY to generate each rising latch signal SLiR and latch each falling sampled signal SSiF in synchronization with the write master clock signal PWY to generate each falling latch signal SLiF.

Figure 10:
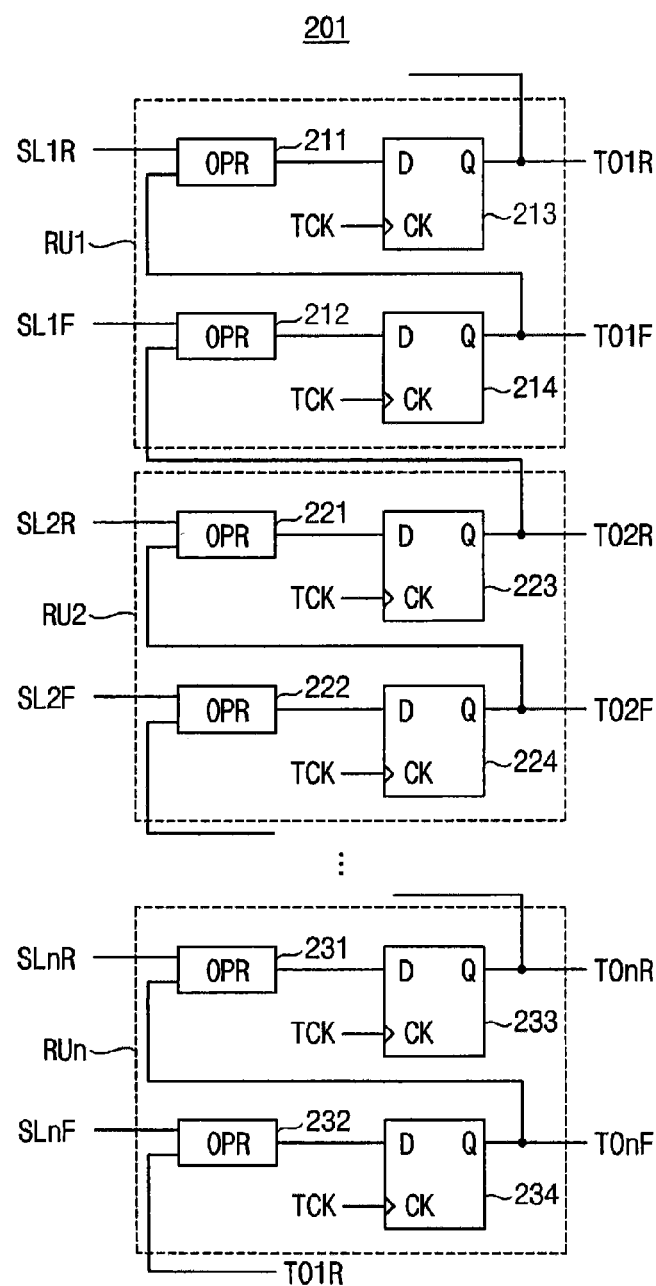
FIG. 10 is a diagram illustrating an example embodiment of a register circuit included in the input-output circuit of FIG. 1.

FIG. 10 is a diagram illustrating an example embodiment of a register circuit included in the input-output circuit of FIG. 1. Referring to FIG. 10, a register circuit 201 may include a plurality of register units RU1~RUn. Each register unit RUi (i=1~n) may receive each rising latch signal SLiR and each falling latch signal SLiF from the latch circuits LAT1~LATn to generate each rising test result signal TOiR and each falling test result signal TOiF.

The first register unit RU1 may include a first operation circuit (OPR) 211 a second operation circuit 212, a first flip-flop 213 and a second flip-flop 214. The second register unit RU2 may include a first operation circuit 221 a second operation circuit 222, a first flip-flop 223 and a second flip-flop 224. In this way, the last register unit, that is, the n-th register unit RUn may include a first operation circuit 231 a second operation circuit 232, a first flip-flop 233 and a second flip-flop 234.

FIG. 10 illustrates an example embodiment corresponding to a case that the data signals IN1~INn are transferred by the DDR scheme. Hereinafter, an example embodiment of the first register unit RU1 is described with reference to FIG. 10. The other register units RU2~RUn have substantially the same configurations as the first register unit RU1, and thus repeated illustration and description are omitted. The operation of the register circuit 201 will be described below with reference to FIG. 13.

The first operation circuit 211 performs a first logical operation on the corresponding rising latch signal SL1R and the corresponding falling test result signal TO1F. The first flip-flop 213 has a data terminal D receiving an output of the first operation circuit 211, a clock terminal CK receiving the test clock signal TCK and an output terminal Q providing the corresponding rising test output signal TO1R. In other words, the first flip-flop 213 latches the output of the first operation circuit 211 in synchronization with the test clock signal TCK to generate the corresponding rising test result signal TO1R.

The second operation circuit 212 performs a second logical operation on the corresponding falling latch signal SL1F and the rising test result TO2R corresponding to the next register unit RU2. The second flip-flop 214 has a data terminal D receiving an output of the second operation circuit 212, a clock terminal CK receiving the test clock signal TCK and an output terminal Q providing the corresponding falling test output signal TO1F. In other words, the second flip-flop 214 latches the output of the second operation circuit 212 in synchronization with the test clock signal TCK to generate the corresponding falling test result signal TGIF.

As such, the output of the latter register unit may be provided as the input of the former register unit. Particularly, the rising test result TO1R of the first register unit RU1 may be input to the second operation circuit 232 of the last register unit RUn such that the register units RUl1~RUn may form a feedback loop.

Figures 11, 12:
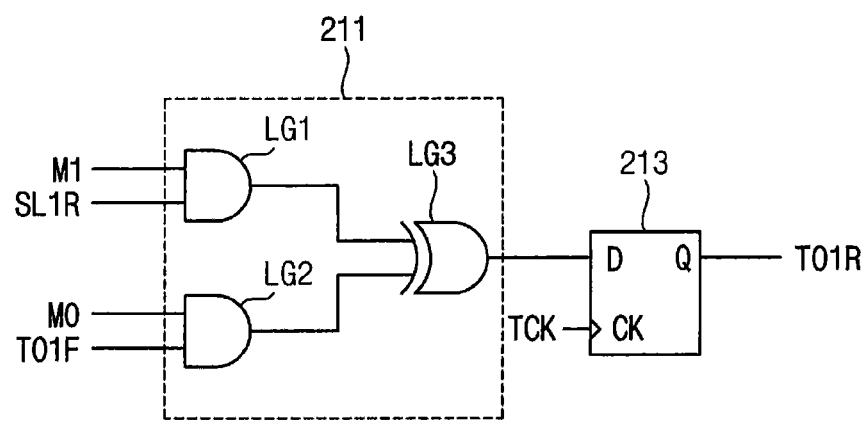
FIG. 11 is a diagram illustrating an example embodiment of an operation circuit included in the register circuit of FIG. 10.
FIG. 12 is a diagram for describing an operation of the operation circuit of FIG. 11.

FIG. 11 is a diagram illustrating an example embodiment of an operation circuit included in the register circuit of FIG. 10, and FIG. 12 is a diagram for describing an operation of the operation circuit of FIG. 11. FIG. 11 illustrates an example embodiment of the first operation circuit 211 in FIG. 10. The second operation circuit 212 in FIG. 10 may have substantially the same configuration as the first operation circuit 211 and the repeated illustration and description are omitted.

Referring to FIG. 11, the first operation circuit 211 may include a first logic gate LG1, a second logic gate LG2 and a third logic gate LG3. The first logic gate LF1 performs a logical operation on the rising latch signal SL1R and a first control signal M1. The second logic gate LG2 performs a logical operation on the falling test result signal TOIF and a second control signal M0. The third logic gate LG3 performs a logical operation on the outputs of the first and second logic gates LG1 and LG2. The output of the third logic gate LG3 is provided to the first flip-flop 213 so that the first flip-flop 213 may latch the output of the third logic gate LG2 in synchronization with the test clock signal TCK to generate the rising test result signal TO1R.

FIG. 12 illustrates an example operation of the first operation circuit 211 when the first and second logic gates LG1 and LG2 are implemented as AND logic gates and the third logic gate LG3 is implemented as an XOR logic gate. Referring to FIGS. 10, 11 and 12, the register circuit 201 may perform various functions depending on the logic levels of the first and second control signals M1 and M0.

When the first control signal M1 has the logic low level (that is, the value of "0") and the second control signal M0 has the logic low level, the first logic gate LG1 outputs the logic low level regardless of the logic level of the rising latch signal SL1R and the second logic gate LG2 outputs the logic low level regardless of the falling test result signal TO1F. In this case, the third logic gate LG3 outputs always the same logic level and thus the register circuit 201 may perform a reset function.

When the first control signal M1 has the logic low level and the second control signal M0 has the logic high level (that is, the value of "1"), the first logic gate LG1 outputs the logic low level regardless of the logic level of the rising latch signal SL1R and the second logic gate LG2 outputs the logic level depending on the logic level of the falling test result signal TO1F. In this case, the third logic gate LG3 outputs the logic level depending on the logic level of the falling test result signal TO1F regardless of the logic level of the rising latch signal SL1R and thus the register circuit 201 may perform a linear feedback shift register (LFSR) function.

When the first control signal M1 has the logic high level and the second control signal M0 has the logic low level, the first logic gate LG1 outputs the logic level depending on the logic level of the rising latch signal SL1R and the second logic gate LG2 outputs the logic low level regardless of the logic level of the falling test result signal TO1F. In this case, the third logic gate LG3 outputs the logic level depending on the logic level of the rising latch signal SL1R regardless of the logic level of the falling test result signal TO1F and thus the register circuit 201 may perform a simple register function.

When the first control signal M1 has the logic high level and the second control signal M0 has the logic high level, the first logic gate LG1 outputs the logic level depending on the logic level of the rising latch signal SL1R and the second logic gate LG2 outputs the logic level depending on the falling test result signal TO1F. In this case, the third logic gate LG3 outputs the logic level depending on the logic levels of the rising latch signal SL1R and the falling test result signal TO1F and thus the register circuit 201 may perform a multiple-input shift register (MISR) function.

As such, the register circuit 201 may perform various functions depending on the logic levels of the control signals M1 and M0. The control signals M1 and M0 may be generated based on the test information stored in the mode register 412 in FIG. 3.

Figure 13:
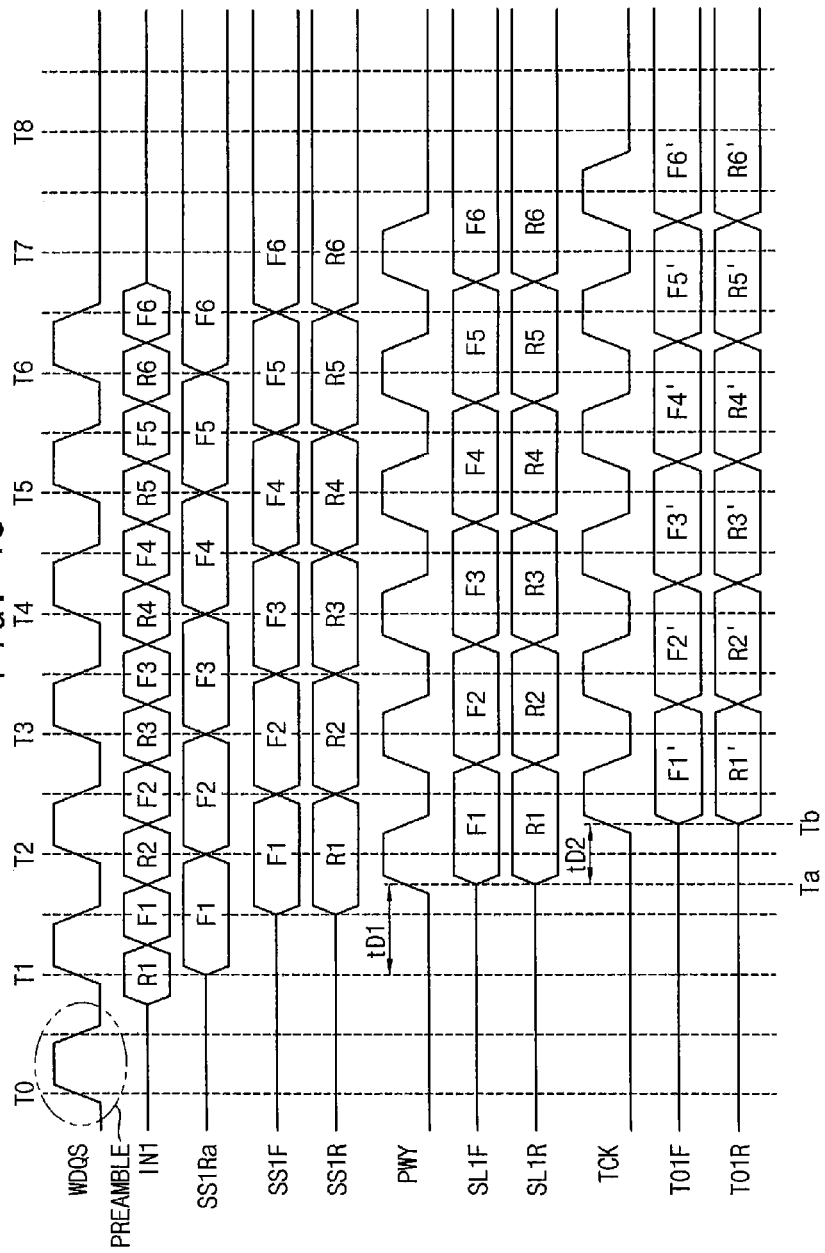
FIG. 13 is a timing diagram illustrating an operation of an input-output circuit according to example embodiments.

FIG. 13 is a timing diagram illustrating an operation of an input-output circuit according to example embodiments. In FIG. 13, the interval between the time points T0~T8 corresponds to a cyclic period of the write data strobe signal WDQS. Referring to FIG. 13, the write data strobe signal WDQS may include a preamble clock in accordance with the normal write protocol. The bits R1~R6 synchronized with the rising edges of the write data strobe signal WDQS and the bits F1~F6 synchronized with the falling edges of the write data strobe signal WDQS are provided through the input signal IN1 by the DDR scheme from the time point T1. As described with reference to FIGS. 5 through 8, the time point T1 corresponds to a time point after the write latency from the write command.

The first flip-flop 132 in FIG. 9 samples the input signal IN1 in synchronization with the rising edges of the write data strobe signal WDQS to provide the output signal SS1Ra and the second flip-flop 133 samples the input signal IN1 in synchronization with the falling edges of the write data strobe signal WDQS to provide the falling sampled signal SS1F. The third flip-flop 134 samples the output signal SS1Ra of the first flip-flop 132 in synchronization with the falling edges of the write data strobe signal WDQS to provide the rising sampled signal SS1R.

The control logic 410 in FIG. 3 generates the write master clock signal PWY based on the write latency, the burst length and the first delay time tD1 stored in the mode register 412. As described above, the first delay time tD1 may be determined based on the setup/hold time of the sampling block 120 in FIG. 1.

The fourth flip-flop 151 in FIG. 9 samples the rising sampled signal SS1R in synchronized with the rising edges of the write master clock signal PWY to output the rising latch signal SL1R. The fifth flip-flop 152 samples the falling sampled signal SS1F in synchronized with the falling edges of the write master clock signal PWY to output the falling latch signal SL1F.

The delay circuit DEL in FIG. 1 delays the write master clock signal PWY by the second delay time tD2 to generate the test clock signal TCK. As described above, the second delay time tD2 may be determined based on the setup/hold time of the latch block 140 in FIG. 1.

The first register unit RU1 in FIG. 10 outputs the rising test result signal TO1R and the falling test result signal TO1F in synchronization with the test clock signal TCK. The bit values R1'~R6' and F1'~F6' of the test result signals TO1R and TO1F may be equal to or different from the bit values R1~R6 and F1~F6 of the input signal IN1.

As such, the input-output circuit of the memory device according to example embodiments may perform the MISR function in accordance with the normal write path and the normal write protocol. The MISR function may be performed efficiently without consideration of additional timing adjustment for the test write operation because the MISR function is performed under the same timing condition as the normal write operation.

Figure 14:
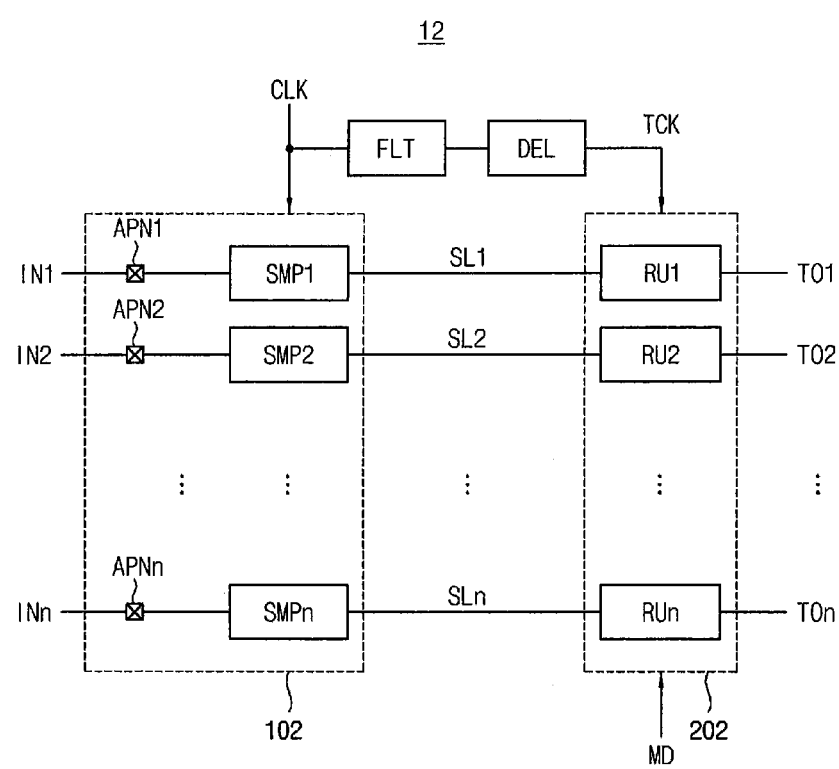
FIG. 14 is a diagram illustrating an input-output circuit according to example embodiments.

FIG. 14 is a diagram illustrating an input-output circuit according to example embodiments. Referring to FIG. 14, an input-output circuit 12 may include a reception circuit 102 and a register circuit 202.

The reception circuit 102 operates in accordance with a normal write protocol commonly in a normal write mode and also in a test write mode. The reception circuit 102 receives a plurality of input signals IN1~INn to generate a plurality of latch signals SL1~SLn. The normal write protocol is the same as described with reference to FIGS. 5 through 8.

The register circuit 202 generates a plurality of test result signals TO1~TOn based on the latch signals SL1~SLn in the test write mode. The register circuit 202 may be disabled in the normal write mode and enabled in the test write mode in response to a mode signal MD indicating the normal write mode or the test write mode. For example, the mode signal MD may be generated from the control logic 410 in FIG. 3 based on test information stored in the mode register 412.

In some example embodiments, the input-output circuit 12 may correspond to an command-address input-output circuit for receiving command-address signals from a host device. In this case, the reception circuit 102 of the command-address input-output circuit 12 may include a plurality of command-address pins APN1~APNn and a plurality of sampling circuits SMP1~SMPn.

The command-address pins APN1~APNn may receive command-address signals as the input signals IN1~INn, respectively. The sampling circuits SMP1~SMPn may sample the command-address signals IN1~INn in synchronization with a system clock signal CLK to generate a plurality of sampled signals SS1~SSn, respectively. The register circuit 200 may include a plurality of register units RU1~RUn configured to receive the latch signals SL1~SLn from the sampling circuits SMP1~SMPn to generate the test result signals TO1~TOn, respectively.

The command-address input-output circuit 12 may further include a filter circuit FLT configured to receive the system clock signal CLK to filter and remove the preamble clock of the system clock signal CLK and a delay circuit DEL configured to delay the output of the filter circuit FLT to generate the test clock signal TCK. The register circuit 202 may operate in synchronization with the test clock signal TCK. As described above, the register circuit 202 may form the feedback loop to perform the MISR function.

In the normal write mode, the latch signals SL1~SLn may be provided to the internal circuit 400 in FIGS. 2 and 3 and the write data of latch signals SL1~SLn may be written in the memory cell array. In the test write mode, the latch signals SL1~SLn may be provided to the register circuit 202 and the latch signals SL1~SLn may be used to generate the test result signals TO1~TOn.

As such, the input-output circuit 12 of the memory device according to example embodiments may perform the MISR function in accordance with the normal write path and the normal write protocol. The MISR function may be performed efficiently without consideration of additional timing adjustment for the test write operation because the MISR function is performed under the same timing condition as the normal write operation. In addition, input-output circuit 12 of the memory device according to example embodiments may enhance reliability of the test result by filtering the command-address signal corresponding to the preamble clock of the system clock signal in case of the test of the command-address link.

Figure 15:
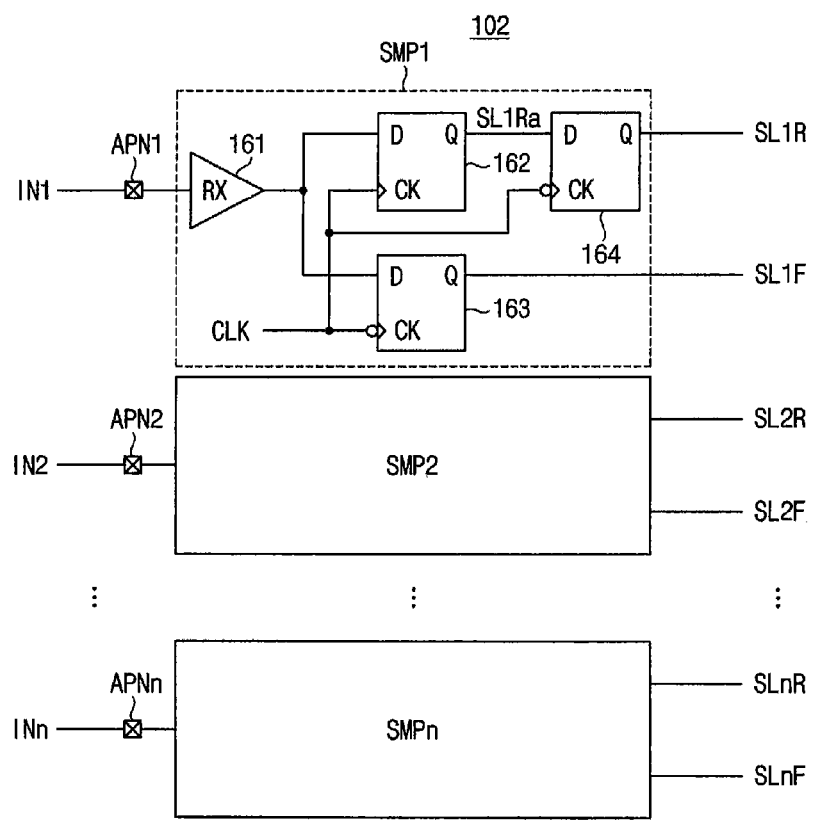
FIG. 15 is a diagram illustrating an example embodiment of a reception circuit included in the input-output circuit of FIG. 14.

FIG. 15 is a diagram illustrating an example embodiment of a reception circuit included in the input-output circuit of FIG. 14. Referring to FIG. 15, a reception circuit 102 may include a plurality of command-address pins APN1~APNn receiving the input signal IN1~INn as the command-address signals and a plurality of sampling circuits SMP1~SMPn.

FIG. 15 illustrates an example embodiment corresponding to a case that the command-address signals IN1~INn are transferred by the DDR scheme. Hereinafter, an example embodiment of the first sampling circuit SMP1 is described with reference to FIG. 15. The other sampling circuits SMP2~SMPn have substantially the same configurations as the first sampling circuit SMP1, and thus repeated illustration and description are omitted. The operation of the reception circuit 102 will be described below with reference to FIG. 16.

The first sampling circuit SMP1 may include a receiver RX 161, a first flip-flop 162, a second flip-flop 163 and a third flip-flop 164. The receiver 161 may buffer the command-address signal IN1 to provide a buffered command-address signal. The first flip-flop 162 has a data terminal D receiving the output of the receiver 161, a clock terminal CK receiving the system clock signal CLK and an output terminal Q providing a sampled signal SL1Ra. The second flip-flop 163 has a data terminal D receiving the output of the receiver 161, a clock terminal CK receiving an inversion signal of the test clock signal CLK and an output terminal Q providing a falling latch signal SL1F. The third flip-flop 164 has a data terminal D receiving the output of the first flip-flop 162, a clock terminal CK receiving the inversion signal of the system clock signal CLK and an output terminal Q providing a rising latch signal SL1R.

As such, each sampling circuit SMPi (i=1~n) is configured to sample each command-address signal INi in synchronization with rising edges of the system clock signal CLK to generate each rising latch signal SLiR and sample each command-address signal INi in synchronization with falling edges of the system clock signal CLK to generate each falling latch signal SLiF. The register circuit 202 in the input-output circuit 12 of FIG. 14 may have substantially the same configuration as the register circuit 201 in FIG. 10, and the repeated illustration and description are omitted.

Figure 16:
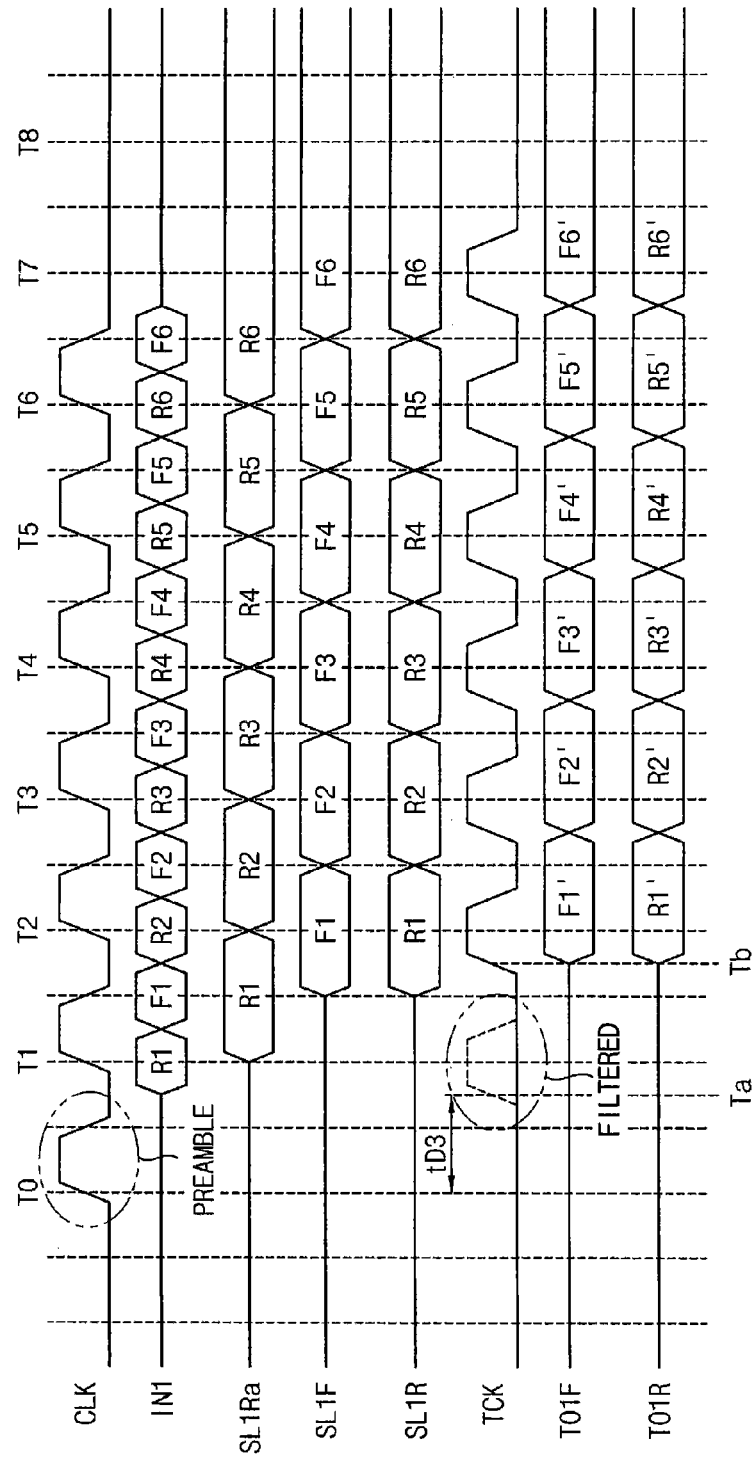
FIG. 16 is a timing diagram illustrating an operation of an input-output circuit according to example embodiments.

FIG. 16 is a timing diagram illustrating an operation of an input-output circuit according to example embodiments. In FIG. 16, the interval between the time points T0~T8 corresponds to a cyclic period of the system clock signal CLK. Referring to FIG. 16, in the test write mode, the system clock signal CLK may maintain a deactivated state and begin to toggle when the command-address signal IN1 is transferred. The system clock signal CLK may include a preamble clock in accordance with the normal write protocol and the bits of the command-address signal IN1 may be transferred from the host device in synchronization with clocks of the system clock signal next to the preamble clock. The bits R1~R6 synchronized with the rising edges of the system clock signal CLK and the bits F1~F6 synchronized with the falling edges of the system clock signal CLK are provided through the command-address signal IN1 by the DDR scheme from the time point T1.

The first flip-flop 162 in FIG. 15 samples the command-address signal IN1 in synchronization with the rising edges of the system clock signal CLK to provide the output signal SL1Ra and the second flip-flop 163 samples the command-address signal IN1 in synchronization with the falling edges of the system clock signal CLK to provide the falling latch signal SL1F. The third flip-flop 164 samples the output signal SL1Ra of the first flip-flop 122 in synchronization with the falling edges of the system clock signal CLK to provide the rising latch signal LS1R.

The filter circuit FLT in FIG. 14 receives the system clock signal CLK to filter and remove the preamble clock, and delay circuit DEL delays the output of the filter circuit FLT by a third delay time tD3 to generate the test clock signal TCK. The third delay time tD3 may be determined based on the setup/hold time of the sampling circuits SMP1~SMPn in FIG. 14.

In the normal write mode, the bits of the command-address signals are transferred from the host device to the memory device while the system clock signal CLK is toggling. In contrast, in the test write mode, the system clock signal CLK maintains the deactivated state and begin toggling for transferring the bits of the command-address signal. The preamble clock is included in the system clock signal CLK for enhancing signal integrity and the test clock signal TCK may be generated by removing the preamble clock.

The first register unit RU1 in FIG. 10 outputs the rising test result signal TO1R and the falling test result signal TO1F in synchronization with the test clock signal TCK. The bit values R1'~R6' and F1'~F6' of the test result signals TO1R and TO1F may be equal to or different from the bit values R1~R6 and F1~F6 of the input signal IN1.

As such, the input-output circuit 12 of the memory device according to example embodiments may perform the MISR function in accordance with the normal write path and the normal write protocol. The MISR function may be performed efficiently without consideration of additional timing adjustment for the test write operation because the MISR function is performed under the same timing condition as the normal write operation. In addition, input-output circuit 12 of the memory device according to example embodiments may enhance reliability of the test result by filtering the command-address signal corresponding to the preamble clock of the system clock signal in case of the test of the command-address link.

Figure 17:
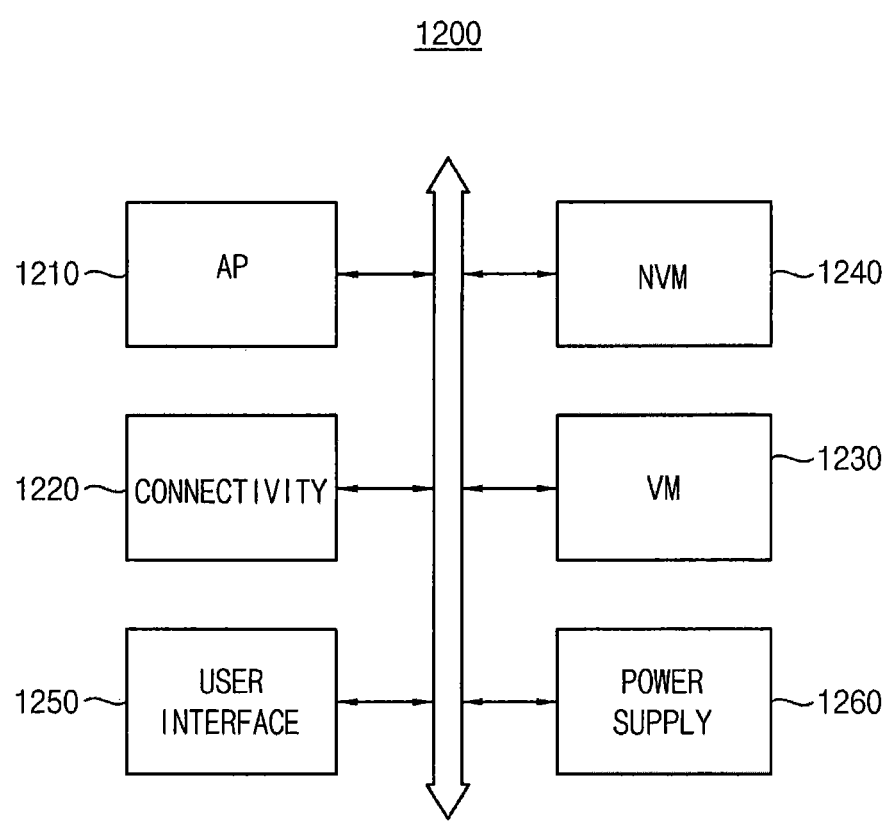
FIG. 17 is a block diagram illustrating a mobile system according to example embodiments.

FIG. 17 is a block diagram illustrating a mobile system according to example embodiments. Referring to FIG. 17, a mobile system 1200 includes an application processor 1210, a connectivity unit 1220, a volatile memory device (VM) 1230, a nonvolatile memory device 1240, a user interface 1250, and a power supply 1260.

The application processor 1210 may execute applications such as a web browser, a game application, a video player, etc. The connectivity unit 1220 may perform wired or wireless communication with an external device. The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. The nonvolatile memory device 1240 may store a boot image for booting the mobile system 1200 and other data. The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

The volatile memory device 1230 and the nonvolatile memory device 1240 may include an input-output circuit as described with reference to FIGS. 1 through 16. The input-output circuit may perform the MISR function in accordance with the normal write path and the normal write protocol. The MISR function may be performed efficiently without consideration of additional timing adjustment for the test write operation because the MISR function is performed under the same timing condition as the normal write operation. In addition, input-output circuit of the memory device according to example embodiments may enhance reliability of the test result by filtering the command-address signal corresponding to the preamble clock of the system clock signal in case of the test of the command-address link.

The present inventive concept may be applied to any devices and systems including a memory device. For example, the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. An integrated circuit device, comprising:
an input/output (IO) circuit having a reception circuit and a register circuit therein, said reception circuit configured support both normal write and test write modes, generate a plurality of latch signals to said register circuit during the test write mode and comprising (i) a plurality of sampling circuits configured to generate a corresponding plurality of sampled signals by sampling data signals received by said I/O circuit at a double data rate (DDR) in-sync with a write data strobe signal, and (ii) a plurality of latch circuits configured to latch the plurality of sampled signals at a double data rate (DDR) in-sync with a write master clock signal.

2. The device of claim 1, wherein said register circuit operates in-sync with a delayed version of the write master clock signal.

3. An integrated circuit device, comprising:
an input/output (IO) circuit having a reception circuit and a register circuit therein, said reception circuit configured support both normal write and test write modes, generate a plurality of latch signals and receive a plurality of input signals, and said register circuit configured to generate a plurality of test result signals in response to the plurality of latch signals when said reception circuit is disposed in the test write mode;
wherein said reception circuit comprises:
a plurality of sampling circuits configured to generate a corresponding plurality of sampled signals by sampling data signals received by said I/O circuit in-sync with a write data strobe signal; and
a plurality of latch circuits configured to latch the plurality of sampled signals in-sync with a write master clock signal;
wherein each of said plurality of sampling circuits is configured to generate rising sampled signals by sampling corresponding data signals in-sync with rising edges of the write data strobe signal and generate falling sampled signals by sampling the corresponding data signals in-sync with falling edges of the write data strobe signal; and
wherein each of said plurality of latch circuits is configured to generate rising latch signals by latching each of the rising sampled signals in-sync with the write master clock signal and generate falling latch signals by latching each of the falling sampled signals in-sync with the write master clock signal.

4. The device of claim 3, wherein said register circuit includes a plurality of registers configured to receive the rising and falling latch signals in-sync with a test clock signal, which is a delayed version of the write master clock signal.

5. The device of claim 4, wherein each of the plurality of registers includes:
a first operation circuit configured to perform a first logical operation on a corresponding rising latch signal and a corresponding falling test result signal generated by a respective one of the plurality of registers; and
a second operation circuit configured to perform a second logical operation on a corresponding falling latch signal and a corresponding rising test result signal generated by a respective one of the plurality of registers.

6. The device of claim 1, wherein the data signals received by said I/O circuit are command-address signals.

7. An input-output circuit comprising:
a reception circuit configured to operate in accordance with a normal write protocol commonly in a normal write mode and a test write mode and configured to receive a plurality of input signals to generate a plurality of latch signals; and
a register circuit configured to generate a plurality of test result signals based on the latch signals in the test write mode,
wherein the reception circuit generates the plurality of latch signals in synchronization with a write master clock signal that is generated based on a write latency and a burst length in accordance with the normal write protocol, and
wherein the register circuit generates the plurality of test result signals in synchronization with a test clock signal that is a delayed version of the write master clock signal.

8. The input-output circuit of claim 7, wherein the reception circuit includes:
a plurality of data pins receiving data signals as the input signals;
a plurality of sampling circuits configured to sample the data signals in synchronization with a write data strobe signal to generate a plurality of sampled signals; and a plurality of latch circuits configured to latch the sampled signals in synchronization with the write master clock signal to generate the latch signals.

9. The input-output circuit of claim 7, further comprising:
a delay circuit configured to delay the write master clock signal to generate the test clock signal,
wherein the register circuit is configured to operate in synchronization with the test clock signal.

10. The input-output circuit of claim 7, wherein the reception circuit includes;
a plurality of command-address pins receiving command-address signals as the input signals;
a plurality of sampling circuits configured to sample the command-address signals in synchronization with a system clock signal provided from a host device to generate the latch signals.

11. The input-output circuit of claim 10, wherein, in the test write mode, the system clock signal maintains a deactivated state and begins to toggle when the command-address signals are transferred.

12. The input-output circuit of claim 11, wherein the system clock signal includes a preamble clock and bits of the command-address signals are transferred from the host device in synchronization with clocks of the system clock signal next to the preamble clock.

13. The input-output circuit of claim 12, further comprising:

a filter circuit configured to receive the system clock signal to filter and remove the preamble clock; and
a delay circuit configured to delay an output of the filter circuit to generate a test clock signal,
wherein the register circuit is configured to operate in synchronization with the test clock signal.

14. The input-output circuit of claim 10, wherein each of the sampling circuits is configured to sample each of the command-address signals in synchronization with rising edges of the system clock signal to generate each of rising latch signals and sample each of the command-address signals in synchronization with falling edges of the system clock signal to generate each of falling latch signals.

15. The device of claim 1, wherein each of said plurality of sampling circuits is configured to generate rising sampled signals by sampling corresponding data signals in-sync with rising edges of the write data strobe signal and generate falling sampled signals by sampling the corresponding data signals in-sync with falling edges of the write data strobe signal; and wherein each of said plurality of latch circuits is configured to generate rising latch signals by latching each of the rising sampled signals in-sync with the write master clock signal and generate falling latch signals by latching each of the falling sampled signals in-sync with the write master clock signal.

* * * * *